United States Patent [19]
Rodder

[11] Patent Number: 6,160,299
[45] Date of Patent: Dec. 12, 2000

[54] SHALLOW-IMPLANT ELEVATED SOURCE/DRAIN DOPING FROM A SIDEWALL DOPANT SOURCE

[75] Inventor: Mark S. Rodder, University Park, Tex.

[73] Assignee: Texas Instruments Incorporated, Dallas, Tex.

[21] Appl. No.: 09/140,036

[22] Filed: Aug. 26, 1998

Related U.S. Application Data

[60] Provisional application No. 60/057,264, Aug. 29, 1997.

[51] Int. Cl.[7] .................................................. H01L 31/119
[52] U.S. Cl. ......................... 257/408; 257/336; 257/338; 257/344
[58] Field of Search .................................. 257/408, 336, 257/338, 344

[56] References Cited

U.S. PATENT DOCUMENTS

| | | | |
|---|---|---|---|
| 5,079,180 | 1/1992 | Rodder et al. | 437/44 |
| 5,496,750 | 3/1996 | Moslehi | 437/41 |
| 5,640,037 | 6/1997 | Blanchard | 257/369 |
| 5,663,079 | 9/1997 | Blanchard | 438/138 |

OTHER PUBLICATIONS

IEEE Electron Device Letters, vol. 10, No. 10, Oct. 1989, "Reverse Short–Channel Effects on Threshold Voltage in Submicrometer Salicide Devices," pp. 446–448 (Chih–Yuan Lu, Senior Member, IEEE and J.M. Sung).

IEEE Electron Device Letters, vol. 18, No. 6, Jun. 1997, "0.18–$\mu$m Fully–Depleted Silicon–On–Insulator MOSFET's," pp. 251–253 (Min Cao, Member IEEE, Ted Kamins, Fellow IEEE, Paul Vande Voorde, Member IEEE, Carlos Diaz, Member IEEE, and Wayne Greene, Member IEEE).

1992 IEEE, IEDM 92–885, "Reverse Elevated Source/Drain (RESD) MOSFET for Deep Submicron CMOS," pp. 23.2.1–35.2.4 (J.R. Pfiester, M. Woo, J.T. Fitch and J. Schmidt).

1993 IEEE, IEDM 93–119, "Sub–50 NM Gate Length N–MOSFETs With 10 NM Phosporus Source and Drain Junctions," pp. 6.2.1–6.2.4 (Mizuki Ono, Masanobu Saito, Takashi Yoshitomi, Claudio Fiegna, Tatsuya Ohguro and Hiroshi Iwai).

1992 IEEE, IEDM 92–853, "Facet Engineered Elevated Source/Drain by Selective Si Epitaxy for 0.35 Micron MOSFETs," pp. 33.7.1–33.7.4 (Carlos Mazure, Jon Fitch and Craig Gunderson).

1992 IEEE, IEDM 92–855, "Reverse Elevated Source/Drain (RESD) MOSFET for Deep Submicron CMOS," pp. 35.2.1–35.2.4 (J.R. Pfiester, M. Woo, J.T. Fitch and J. Schmidt).

IEEE Electron Device Letters, vol. 12, No.3, Mar.1991, "Raised Source/Drain MOSFET With Dual Sidewall Spacers," pp. 89–91 (Mark Rodder, Member IEEE, and D. Yeakley).

*Primary Examiner*—Fetsum Abraham
*Attorney, Agent, or Firm*—Jacqueline J. Garner; W. James Brady, III; Frederick J. Telecky, Jr.

[57] ABSTRACT

A structure having shallow-implanted elevated source/drain regions is formed with doped sidewall spacers. Diffusion of dopants from the sidewall spacers forms a doped region extending from underneath the gate electrode, along the edge of the epitaxial layer, to the doped (and uppermost) regions of the elevated source/drain. Low junction capacitance, is achieved because the shallow implant of the elevated source/drain regions places the junction inside the source/drain region itself. Low source/drain resistance is achieved because the diffused doped region provides a doped path between the shallow implanted region of the elevated source/drain and the channel region. Low source/drain junction depth is achieved because a second spacer can prevent dopant from being implanted through any faceted areas of the epitaxial layer. The doped extensions of the source/drain regions also have exceptionally low junction depth. The overall process is simpler because it is independent of both facet angle and height of the epitaxial layer.

10 Claims, 4 Drawing Sheets

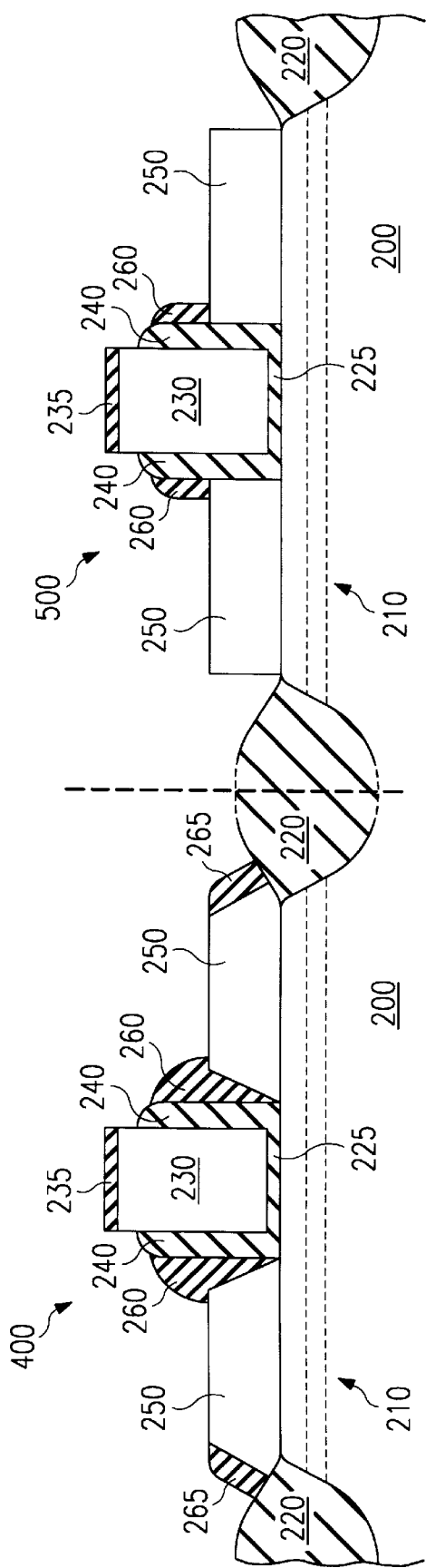
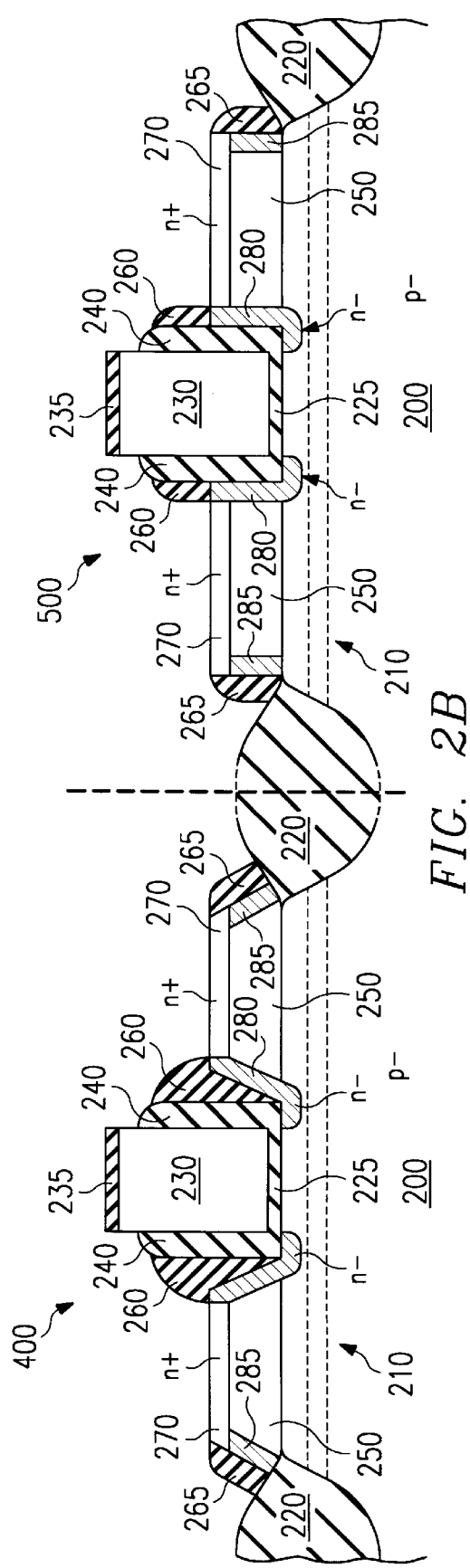
FIG. 2A
FIG. 2B

SHALLOW-IMPLANT ELEVATED SOURCE/DRAIN DOPING FROM A SIDEWALL DOPANT SOURCE

This application claims priority under 35 USC §119 (e)(1) of provisional application No. 60/057,264, filed Aug. 29, 1997.

BACKGROUND AND SUMMARY OF THE INVENTION

The present invention relates to integrated circuit structures and fabrication methods, and specifically to doping of elevated source/drain structures having a shallow implant.

Background: Elevated Source/Drain Junctions

As CMOS is scaled to deep submicron regime (i.e., tenth-micron and below), MOSFETs need to have low source/drain resistance, low source/drain junction depth, and (importantly) low junction capacitance. Elevated source/drain (S/D) junction MOSFETs have been found useful in eliminating short channel and hot-carrier behavior in deep submicron CMOS technologies. See e.g., J. R. Pfiester et al., "Reverse Elevated Source/Drain (RESD) MOSFET for Deep Submicron CMOS," IEDM 885 (1992), which is hereby incorporated by reference. In this approach, silicon deposited by selective epitaxy forms islands of silicon crystals on a silicon substrate to extend source/drain regions upward. This upwardly extended region will be referred to as an elevated source/drain. However, not all of this region functions electrically as a source/drain because the entire raised region is not all doped with the source/drain's conductivity type.

Processes using selective epitaxial deposition for the engineering of elevated source/drain regions have performance problems which are related to, among other things, facet formation. Faceting is caused by the anisotropy of the selective epitaxial deposition process. Therefore, depending on orientation of the specific device in relation to the crystal axes of the wafer, faceting may or may not occur. For example, orientation 606 shown in FIG. 5 results in facet formation during the selective epitaxial deposition process. Faceting causes a thinning of the epitaxial silicon near the field dielectric and gate edges.

Dual sidewall spacers have been proposed to prevent some of the problems caused by faceted regions. See e.g., Mark Rodder, "Raised Source/Drain MOSFET with Dual Sidewall Spacers," 12 *IEEE Electron Device Letters* 89 (1991), which is hereby incorporated by reference. FIG. 6A shows a previously disclosed elevated source/drain MOSFET with dual sidewall spacers 240' and 260'. First spacer 240' was formed, then LDD n− (or p− for PMOS) regions 214 were implanted. Elevated source/drain regions 250' were formed next by selective epitaxial silicon deposition. Second spacer 260' was then formed to overlie any faceted regions of the epitaxial silicon 250' near the gate edge. High-dose n+ (or p+) implants were then performed into elevated source/drain regions 250' to form source/drain doped regions 216. Because second spacer 260' overlies any faceted regions of the epitaxial silicon 250', source/drain dopants are prevented from being implanted through these faceted regions, which would otherwise result in a deeper than desired junction depth. This method, however, does not provide low junction capacitance in addition to low source/drain resistance and shallow junction depth.

Attempts have been made to avoid these problems by controlling the facet angle. See e.g., Mazure et al., "Facet Engineered Elevated Source/Drain by Selective Si Epitaxy for 0.35 Micron MOSFETs", IEDM, 853 (1992), which is hereby incorporated by reference. However, this method is dependent on controlling the angle of the facet formed, thus imposing additional requirements on process control which may not be easy to meet.

Nonfaceted transistors may also pose a problem. In particular, elevated source/drain regions of nonfaceted transistors have vertical sidewalls. These vertical sidewalls will not be doped by a shallow implant. Thus, if the epitaxial material is undoped and a shallow N+ implant is used (as is desirable to minimize capacitance), a gap will exist between the implanted N+ part of the elevated source/drain and the channel region. This gap makes the transistor inoperable, or at least decreases drive capability.

Background: Shallow Junctions from Doped Sidewall Spacers

Shallow junctions have previously been designed for study in an experimental structure. The shallow junctions were formed by a technique of solid-phase diffusion from sidewall spacers of phosphorous-doped (or boron-doped) silicated glass. See Ono et al., "Sub-50 nm Gate Length N-MOSFETS with 10 nm Phosphorous Source and Drain Junctions," IEDM 119 (1993), which is hereby incorporated by reference. In this experimental technique illustrated in FIG. 6B, a 40 nm gate length polysilicon gate 130 was formed on 3 nm thick gate insulator 120, which was formed on substrate 100. PSG (or BSG) sidewalls 140 were formed to be 190 nm thick, and then used as a mask, along with gate 130, to implant deep source/drain regions 150 into substrate 100. A rapid thermal anneal followed, which caused the phosphorous (or boron) to diffuse into substrate 100, forming shallow junctions (10 nm) 160 next to deep source/drain regions 150 in substrate 100.

Elevated Shallow-Implanted Source/Drain with Additional Doping from a Sidewall Dopant Source The present application discloses a facet-angle-independent process to provide low junction capacitance, low source/drain (S/D) resistance and shallow junction depth for both faceted and non-faceted transistors. The disclosed method uses sidewall spacers as a solid dopant source. Dopants from the sidewall spacers outdiffuse upon annealing to form a doped extension from the doped regions of the elevated source/drain, along the edge of source/drain regions, to underneath the gate electrode. This doped extension creates a path between the shallow implanted region of the elevated source/drain and the channel region.

Low junction capacitance is achieved because the shallow implant of the elevated source/drain regions places the junction inside the source/drain region itself. Low source/drain resistance is achieved because the additional diffused doped region provides a doped path from source/drain regions to the channel region. In a sample embodiment, low source/drain junction depth is achieved because a second spacer prevents dopant from being implanted into the substrate through any faceted areas. Furthermore, the doped extensions of the source/drain regions have exceptionally low junction depth. A shallow implant of source/drain regions avoids dopant segregation to implant damaged regions because areas at the edge of the channel region are less likely to be damaged by a shallow implant. The overall process is simpler because it is not facet angle dependent.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 2A shows a transistor structure with both faceted and non-faceted elevated source/drain regions and dual doped sidewall spacers prior to a heat step.

FIG. 2B shows the transistor structure of FIG. 2A after a heat step.

Corresponding numerals and symbols in the different figures refer to corresponding parts unless otherwise indicated.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Process Overview

Figure 1:
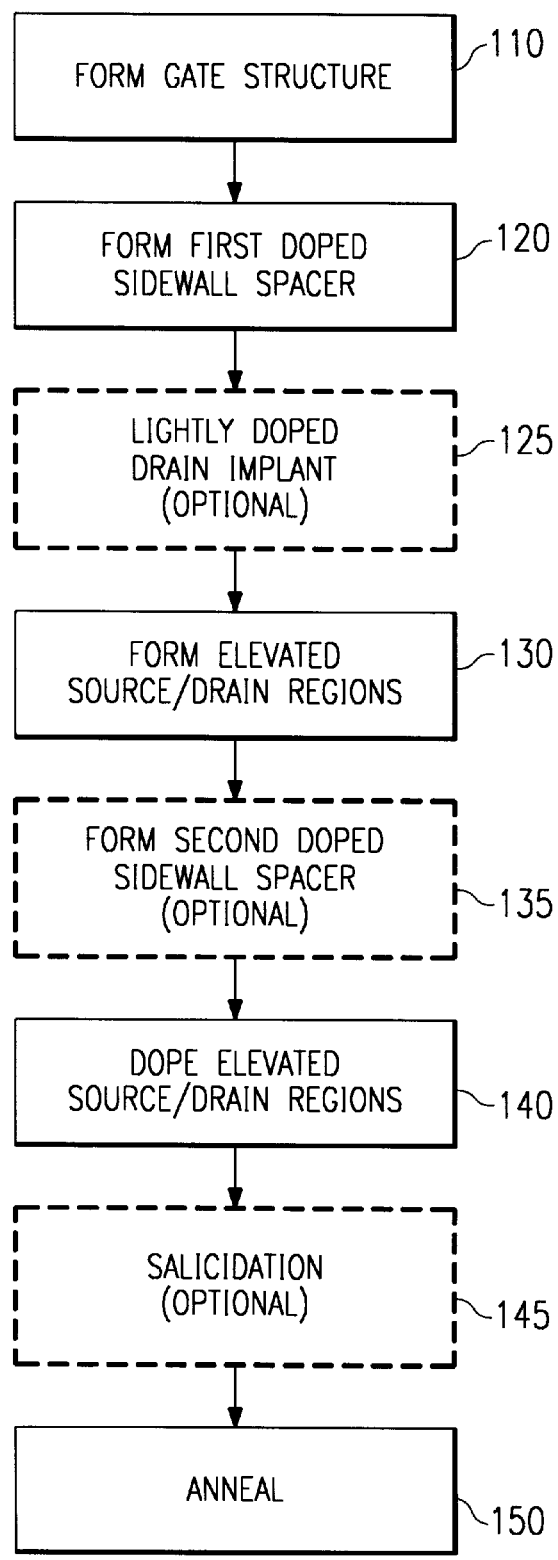
FIG. 1 is a process flow for forming an elevated source/drain transistor with doped sidewall spacers.

The main steps in the process flow of FIG. 1 will now be discussed in conjunction with FIGS. 2A and 2B, which show various stages in the process.

Figure 5:
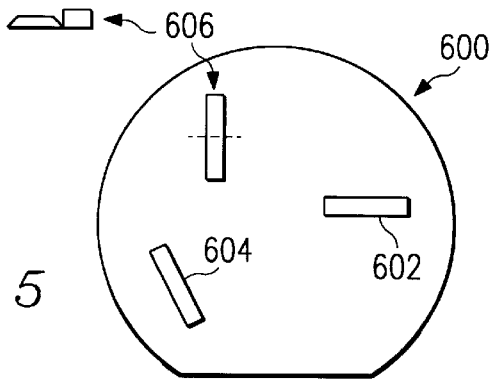
FIG. 5 shows a diagram of how various device orientations lead to faceted and non-faceted structures.

FIG. 2A shows transistor structures 400 (source/drain regions with faceted areas) and 500 (source/drain regions without faceting). Occurrence of faceting during selective epitaxial deposition is determined in part by device orientations in relation to wafer 600 as shown in FIG. 5. Orientation 606 results in faceted structures, while orientations 602 and 604 do not. Thus, in this example transistor structures 400 and 500 are not physically parallel. (Other process and device features may also affect faceting or lack thereof.)

Referring to FIG. 2A, shallow doped channel regions 210 are formed in semiconductor substrate 200. Field isolation dielectrics 220, generally of oxide, have also been formed in substrate 200. Gates 230 are formed over gate dielectric 225 on substrate 200, preferably with a dielectric cap 235. This completes Step 110.

Next, a first sidewall spacer 240, which may or may not contain dopant, is formed along the exposed gate edges. This completes Step 120.

Elevated source/drain regions 250 may be formed in a variety of ways, such as from crystalline or polycrystalline selectively deposited material. Faceting has occurred in transistor 400 during formation of source/drain regions 250, but not in transistor 500. Once source/drain regions 250 have been formed, the protective cap 235 over the gate structure may be selectively removed. This completes Step 130.

Second doped sidewall spacer 260 may be formed to overlie any faceted regions of source/drain regions 250 near the first sidewall spacer 240. (When second sidewall spacer 260 is formed, a spacer 265 may also form along the epitaxial silicon edge nearest the field dielectric 220. It is noted that the width of this spacer 265 is dependent in part on the facet angle.) The minimum thickness of the second spacer is chosen to substantially cover any faceted regions and to provide for a sufficient total sidewall oxide thickness to prevent source/drain-to-gate shorts during a subsequent salicidation process. This completes optional Step 135.

Doped source/drain regions 270, shown in FIG. 2B, were formed prior to anneal by shallow implant of elevated source/drain region 250 with an appropriate dopant (depending on the type of transistor desired) or by doping from an additional doped oxide overcoat. This completes Step 140.

FIG. 2B shows the structure of FIG. 2A after anneal. Outdiffusion of dopants from the sidewall spacers into elevated source/drain region 250 during anneal results in a doped region 280 extending from underneath the gate electrode, along the epitaxial edge, to the doped source/drain region 270. (A slight outdiffusion 285 into elevated source/drain region 250 may also result from any second spacer 265.) Extension 280 preferably replaces a conventional shallow n− implant. In a structure without such an implant, the n-type region is inside the elevated source/drain, rather than in the substrate. This completes Step 150.

Sample Embodiments:

In the embodiment depicted in FIG. 2A, substrate 200 is preferably silicon. A gate (e.g. of sub-0.3 micron length), was formed by growing 6 nanometers of gate oxide 225, followed by deposition of 250 nanometers of poly-silicon 230 which was implanted at a dose of $5*10^{15}$ cm$^{-2}$ with phosphorous. 150 nanometers of oxide was then deposited. The oxide/poly stack was then etched to form a gate with a cap oxide 235. Cap oxide 235 is preferably present at this time to prevent epitaxial silicon deposition during subsequent processing.

First sidewall spacer 240 is then deposited, to a film thickness of 40 nm, by chemical vapor deposition. Sample conditions for deposition of PSG are shown, for example, in DeCrosta et al., "Characterization of high oxygen:tetraethylorthosilicate ratio plasma-enhanced chemical vapor deposited films," 143 J. Electrochem. Soc. 1079 (1996); Fujino et al., "Doped silicon oxide deposition by atmospheric pressure and low temperature chemical vapor deposition using tetraethoxysilane and ozone," 138 J. Electrochem. Soc. 3019 (1991); Shioya and Maeda, "Comparison of phosphosilicate glass films deposited by three different chemical vapor deposition methods," 133 J. Electrochem. Soc. 1943 (1986).

In this sample embodiment, elevated source/drain regions 250 were formed by selective epitaxy. Specifically, 100–170 nanometers of silicon was epitaxially deposited at 850–900 degrees Celsius. Faceted source/drain regions have resulted in transistor 400, but were not formed in transistor 500.

In FIG. 2B, second doped sidewall spacers 260 overlie any faceted regions of elevated source/drain regions 250 which are next to first sidewall spacers 240. Second doped sidewall spacers 260 are also formed, in the presently preferred embodiment, by conformally depositing PSG, with a thickness of e.g. 40 nm up to 100 nm.

Doped source/drain regions 270 were then formed by shallow implant of an appropriate dopant (e.g. arsenic). The depth of the implant is less than the thickness of the elevated source/drain regions (e.g. 70 nm implant peak for an elevated source/drain thickness of 170 nm, although other depths may be used). In a CMOS process, NMOS and PMOS source/drain regions must be implanted separately.

Source/drain extensions 280 may be diffused 10–20 mn (for example) into source/drain regions 250. These extensions 280 result from outdiffusion of dopants from the sidewall spacers caused by an anneal, in an inert atmosphere, for 10–20 seconds (preferably), at a temperature of 900–1050 C (preferably 1000 C), by rapid thermal annealing.

Alternative Embodiment: Solid Source for P-Type Dopants

The foregoing text has described fabrication of NMOS devices. However, the innovative principles are also applicable to fabrication of PMOS devices. In one class of such embodiments borosilicate glass is used as a dopant source for P-channel devices.

Alternative Embodiment: Semiconductor Second Spacers

In this alternative embodiment, the second spacer is made of polycrystalline silicon or silicon-germanium. This polycrystalline semiconductor material is conformally deposited and anisotropically etched back, to leave it only in the space between the first spacer and the faceted elevated source/drain regions. The polycrystalline silicon or silicon-germanium can be doped by implantation or otherwise. Since diffusion through polycrystalline material proceeds quickly, this material can readily supply doping to the sidewalls of the elevated source/drain regions. Other conditions remain like those stated above. In this embodiment the first spacer provides insulation and a diffusion barrier on the gate sidewall.

Alternative Embodiment: Sidewall Diffusion Barrier

In this class of embodiments, a thin diffusion barrier material (e.g., nitride) is deposited adjacent to the gate and under the first sidewall dopant sources. The dopants would still outdiffuse into the sidewalls of the elevated source/drain regions, but the diffusion barrier would keep dopants away from the gate oxide and away from the silicon substrate substantially near the gate electrode. Other conditions remain like those stated above.

Alternative Embodiment: Single Doped Sidewall Spacer

Figure 3A:
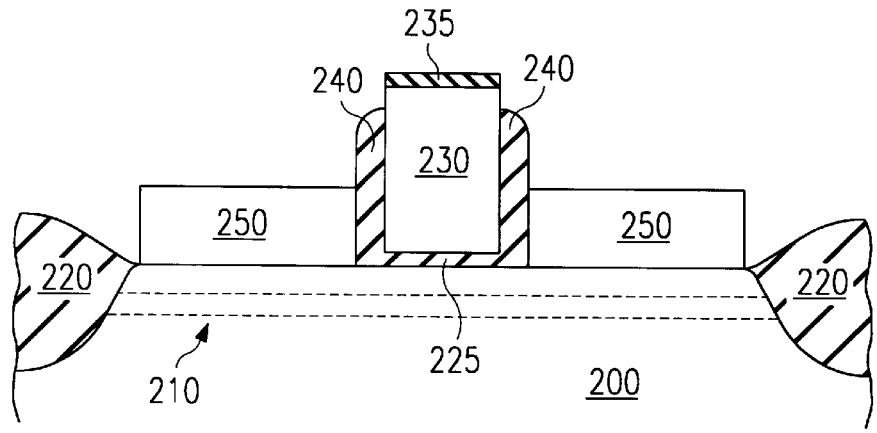
FIG. 3A shows a transistor structure with non-faceted elevated source/drain regions and single doped sidewall spacers prior to a heat step.
Figure 3B:
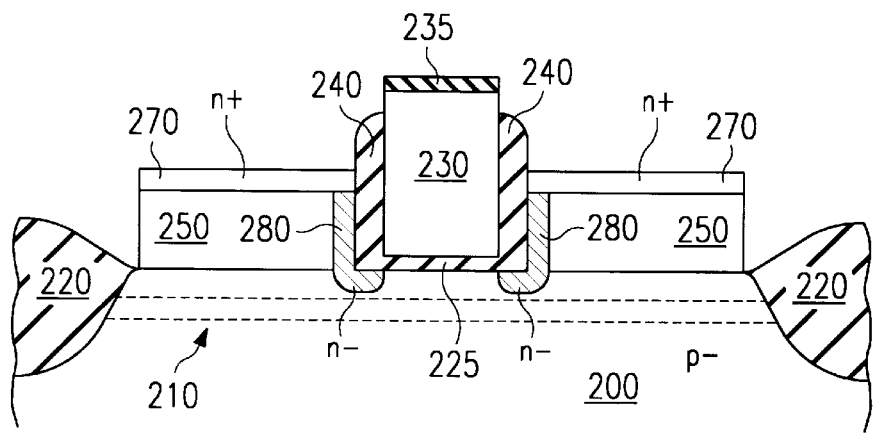
FIG. 3B shows the transistor structure of FIG. 3A after a heat step.
Figure 6A:
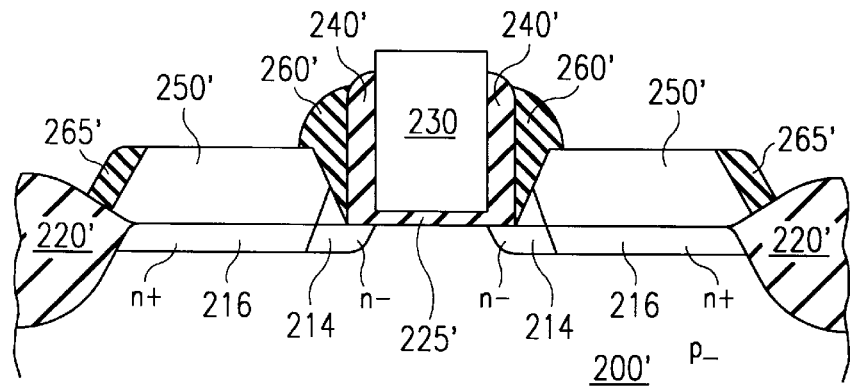
FIG. 6A shows a previously disclosed elevated source/drain structure with dual sidewall spacers.
Figure 6B:
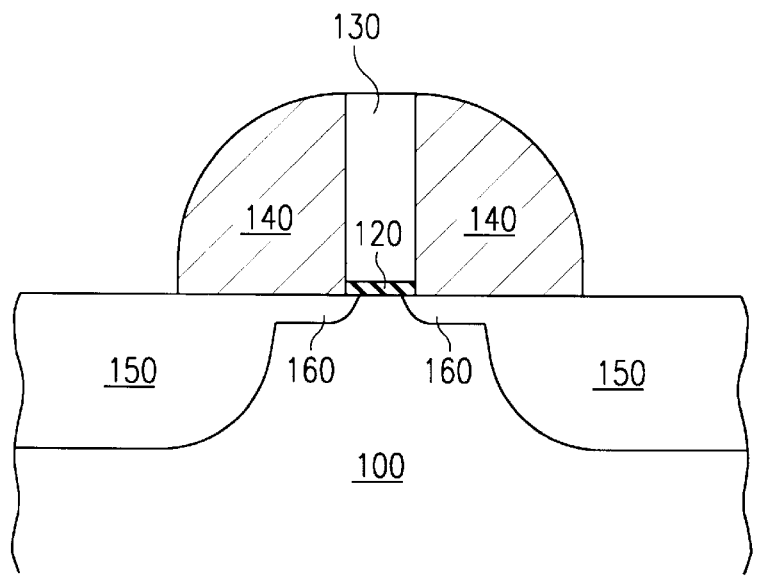
FIG. 6B shows a previously disclosed experimental structure with shallow junctions formed from doped sidewall spacers.

FIGS. 3A and 3B show various stages of an alternative embodiment. In this embodiment, the second spacer (like that of FIG. 2A and 6A) is not used, rather only a first doped spacer is formed. In this embodiment, a shallow implant of the non-faceted elevated source/drain region presents difficulties because of the vertical sidewalls as previously discussed.

FIG. 3A shows the structure prior to diffusion of dopants from sidewall spacer 240. Process conditions remain like those stated above, except that optional Step 135 (forming a second doped sidewall spacer) is not performed.

FIG. 3B shows the structure of FIG. 3A after a doped path 280 has been formed along the vertical sidewalls of source/drain regions 250 by diffusion, as in the sample embodiment, from doped sidewall spacer 240. Other conditions remain like those stated above.

Alternative Embodiment: Single Doped Sidewall Spacer with LDD Implant

Figure 4:
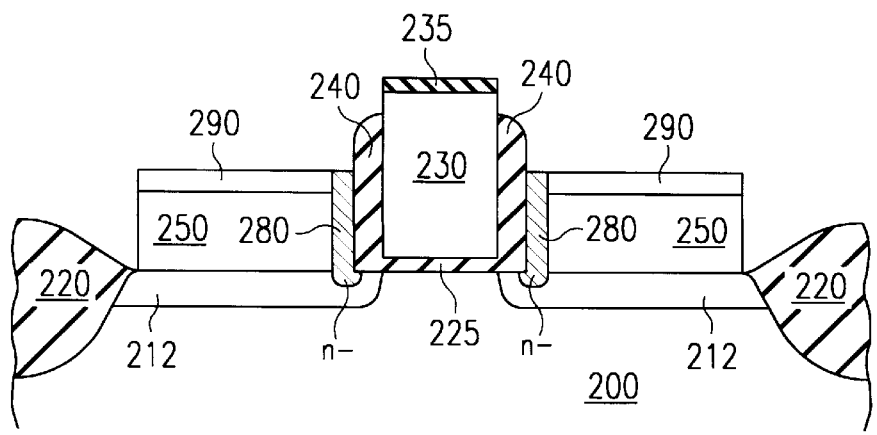
FIG. 4 shows a transistor structure with non-faceted elevated source/drain regions, LDD regions, and single doped sidewall spacers.

FIG. 4 shows a transistor structure with non-faceted elevated source/drain regions 250, LDD regions 212, single doped sidewall spacers 240, and doped path 280 extending from doped sidewall spacers 240 into elevated source/drain regions 250 and down to LDD regions 212. Other conditions remain like those stated above.

This completes optional Step 125. It is noted that both spacers (if present) may still contain dopant even if an LDD region is present.

Alternative Embodiment: Only Second Spacer Doped

Rather than doping both first and second sidewall spacers as in the preferred embodiment, similar beneficial results are predicted when only one sidewall spacer is doped. In this class of embodiments, a shallow implant is used to form Lightly Doped Drain (LDD) regions in the substrate. The first sidewall spacer is not doped and the second sidewall spacer is doped. A larger thickness of first sidewall spacer may be used to achieve a greater lateral separation from elevated source/drain to the gate corner, and hence a longer Lightly Doped Drain (LDD) region in the elevated source/drain region itself. Only the second sidewall spacer contains dopant, and so the diffused region extends into the LDD region, rather than under the gate electrode as in the preferred embodiment. Other conditions remain like those stated above.

Alternative Embodiment: Smiling Oxidation

A smiling oxidation step may be performed if necessary to protect gate corner integrity. Other conditions remain like those above.

Alternative Embodiment: Silicon Nitride Gate Cap

A silicon nitride cap may be formed over the gate instead of the preferred silicon dioxide cap. Other conditions remain like those stated above.

Alternative Embodiment: Nitride Second Sidewall Spacer

Second sidewall spacer 260 may comprise silicon nitride or silicon-oxynitride instead of the preferred silicon dioxide. Other conditions remain like those stated above.

Alternative Embodiment: Third Sidewall Spacer

A third sidewall spacer may be formed by conformal deposition followed by an anisotropic etch. If formed, the third sidewall spacer may or may not be doped. Other conditions remain like those stated above.

Alternative Embodiment: Silicon-Germanium

Silicon-germanium may be used as the substrate and/or elevated source/drain regions rather than the preferred silicon. Other conditions remain like those stated above.

Alternative Embodiment: Salicidation

In this class of embodiments, a self-aligned silicide (salicide) step is performed after the elevated source/drain regions have been doped. Salicidation reduces values of contact resistance, sheet resistivity of the shallow junctions of the source/drain regions, and interconnect resistance of the-gate lines. A metal layer, e.g. 20 nm of titanium, is deposited over the structure and reacted with the exposed silicon areas of the source and drain (and the gate if desired) to form silicide. The unreacted titanium is then selectively removed, leaving the silicide layer 290 where formed on the structure as shown in FIG. 4. Other conditions remain like those stated above. This completes optional Step 145. Note that if salicidation is performed, having second sidewall spacers is particularly advantageous because the second sidewall spacers keeps the titanium and subsequently formed silicide away from the gate and the channel region.

Alternative Embodiment: Furnace Anneal

In this class of embodiments, a furnace anneal is used, instead of the rapid thermal anneal (RTA) of the presently preferred embodiment, to outdiffuse the dopants contained in the sidewall spacers.

Alternative Embodiment: Arsenosilicate Dopant Sources

In this contemplated class of embodiments, the N-type dopant which outdiffuses from the silicate glass is arsenic rather than phosphorus.

Alternative Embodiment: Germanosilicate Dopant Sources

Other solid dopant sources can be used. In one contemplated class of embodiments, phosphogermanosilicate glass can be substituted for phosphosilicate glass in the embodiments described above.

According to a disclosed class of innovative embodiments, there is provided: An integrated circuit structure, comprising: a semiconductor active area; a gate separated from said active area by a gate dielectric; elevated source/drain regions of a semiconductor material lying on said semiconductor active area and respectively on either side of said gate; a localized solid dopant source between said gate and said elevated source/drain regions which contains dopant for said semiconductor material of said elevated source/drain regions; and a doped path along the sidewalls of said elevated source/drain regions.

According to another disclosed class of innovative embodiments, there is provided: An integrated circuit structure, comprising: a first-conductivity-type semiconductor active area; a gate separated from said active area by a gate dielectric; elevated source/drain regions lying on said active area next to sidewalls of said gate, said elevated source/drain regions being formed from a semiconductor material and being heavily doped in upper portions; at least one sidewall spacer between a sidewall of said gate and respective one of said elevated source/drain regions, said at least one sidewall spacer containing a dopant for said semiconductor material of said elevated source/drain regions; and a source/drain extension of a second conductivity type extending from said elevated source/drain regions to underneath said gate; wherein all of said active area under said elevated source/drain regions, except said source/drain extension, has said first conductivity type.

According to another disclosed class of innovative embodiments, there is provided: A fabrication method, comprising the steps of: (a.) forming a gate structure over a semiconductor active area; (b.) forming elevated semiconductor source/drain regions which have shallow doping on said semiconductor active area and on both sides of said gate structure; and (c.) laterally diffusing dopant into sidewalls of said elevated semiconductor source/drain regions from a localized solid dopant source which is aligned to said gate.

According to another disclosed class of innovative embodiments, there is provided: A fabrication method, comprising the steps of: (a.) forming a gate structure over a defined channel region of a substrate; (b.) forming first sidewall spacers next to and on both sides of said gate structure, said first sidewall spacers containing dopant for a semiconductor material; (c.) forming elevated source/drain regions of said semiconductor material next to said first sidewall spacers; and (d.) applying heat to cause diffusion of dopants from said first sidewall spacers into said elevated source/drain regions.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

While the inventions have been described with primary reference to a single-poly process, it will be readily recognized that these inventions can also be applied to process with two, three, or more layers of polysilicon or polycide.

While specific materials have been mentioned in the sample embodiments, other suitable materials may be used. For example, dopants other than phosphorus, arsenic and boron can be used (particularly if the semiconductor is a different material system, such as gallium arsenide, which requires other dopants).

Similarly, other methods (e.g. other deposition chemistries, deposition processes, patterns and etch methods) can alternatively be used to form various components.

While the degree of faceting may be partially controlled by adjusting process parameters of the cleaning and deposition processes, the benefits of the present invention are obtainable independent of facet angle.

What is claimed is:

1. An integrated circuit structure, comprising:

a semiconductor active area;

a gate separated from said active area by a gate dielectric;

elevated source/drain regions of a semiconductor material lying on said semiconductor active area and respectively on either side of said gate;

a doped spacer between said gate and said elevated source/drain regions; and a doped path along the sidewalls of said elevated source/drain regions.

2. The integrated circuit structure of claim 1, further comprising a silicide layer over said elevated source/drain regions.

3. An integrated circuit structure, comprising:

a first-conductivity-type semiconductor active area;

a gate separated from said active area by a gate dielectric;

elevated source/drain regions of a second conductivity type lying on said active area next to sidewalls of said gate, said elevated source/drain regions being formed from a semiconductor material and being heavily doped in upper portions;

at least one sidewall spacer between a sidewall of said gate and respective one of said elevated source/drain regions, said at least one sidewall spacer containing a dopant for said semiconductor material of said elevated source/drain regions; and a source/drain extension of said second conductivity type extending from said elevated source/drain regions to underneath said gate;

wherein all of said active area under said elevated source/drain regions, except said source/drain extension, has said first conductivity type.

4. The integrated circuit of claim 3, further comprising a silicon nitride layer under said at least one sidewall spacer closest to said gate.

5. The integrated circuit of claim 3, further comprising at least two said sidewall spacers on at least one side of said gate, with only one of said sidewall spacers containing more than 1% wt of said dopant.

6. The integrated circuit of claim 3, wherein said semiconductor active area is monocrystalline silicon.

7. An integrated circuit comprising:

a semiconductor body;

a gate electrode separated from said semiconductor body by a gate dielectric;

a doped sidewall spacer located adjacent sidewalls of said gate electrode; and an elevated source/drain region located over said semiconductor body and adjacent said doped sidewall spacer, said doped sidewall spacer comprising a dopant of the same conductivity as the elevated source/drain region.

8. The integrated circuit of claim 7, wherein said doped sidewall spacer comprises a first doped spacer directly adjacent said elevated source/drain region and a second doped spacer directly adjacent said gate electrode.

9. The integrated circuit of claim 7, further comprising an undoped sidewall spacer located between said doped sidewall spacer and said gate electrode.

10. The integrated circuit of claim 7, further comprising a sidewall diffusion barrier between said doped sidewall spacer and said gate electrode.

* * * * *